United States Patent
Franck et al.

(10) Patent No.: US 9,370,117 B2
(45) Date of Patent: Jun. 14, 2016

(54) RECESSED EQUIPMENT BOXES AND RELATED ASSEMBLIES AND METHODS

(71) Applicant: WirePath Home Systems, LLC, Charlotte, NC (US)

(72) Inventors: Christopher Glenn Franck, Fort Mill, SC (US); Jamie Lee Quinlan, Charlotte, NC (US); William Jacob Kozlowski, Waxhaw, NC (US)

(73) Assignee: WirePath Home Systems, LLC, Charlotte, NC (US)

( * ) Notice: Subject to any disclaimer, the term of this patent is extended or adjusted under 35 U.S.C. 154(b) by 161 days.

(21) Appl. No.: 13/966,877

(22) Filed: Aug. 14, 2013

(65) Prior Publication Data

US 2015/0049452 A1    Feb. 19, 2015

(51) Int. Cl.
*H02G 3/12* (2006.01)
*E04F 19/00* (2006.01)
(Continued)

(52) U.S. Cl.
CPC ............... *H05K 7/14* (2013.01); *E04F 19/083* (2013.01); *H02G 3/125* (2013.01); *H05K 7/1405* (2013.01)

(58) Field of Classification Search
CPC ............ B65D 88/546; B65D 90/0053; B65D 90/0073; B65D 90/16; B65D 2205/02; B65D 25/02; B65D 25/20; B65D 31/10; B65D 33/004; B65D 33/02; B65D 5/4204; B65D 5/48016; B65D 5/6605; B65D 75/566; B65D 75/5877; B65D 90/12; H01H 13/04; H01H 13/10; H01H 2223/024; H01H 2223/044; H01H 33/08; H01H 9/285; H01H 9/287; F16M 11/38; B65B 67/1211; E04B 1/19; E04B 2001/199; E04B 5/023; E04B 5/43; E04F 15/02044; E05B 15/00; E06B 1/34; E06B 2009/2643; E06B 3/362; E06B 7/22; F02M 35/0201; F02M 35/0215; F21V 15/01; F28F 9/0075; G06F 1/1616; G06F 1/1658; G06F 1/1684; G08B 13/19619; H02B 13/025; H02B 1/30; H02B 1/38; H02G 1/02; H02G 3/081; H02J 7/0042; H04N 5/2252; H05K 5/0017; H05K 5/0086; H05K 5/02; H05K 5/0213; H05K 7/20136
USPC ............ 361/622, 679.09, 759, 724, 725, 728, 361/807, 825, 826; 312/223.1, 223.2, 312/351.1, 351.6; 220/3.9, 7, 6, 4.28, 4.27, 220/4.23, 4.16, 4.07, 4.02, 3.94, 3.92, 3.8, 220/3.7, 3.6, 3.5, 477; 174/44, 535, 67
See application file for complete search history.

(56) References Cited

U.S. PATENT DOCUMENTS 4,631,634 A * 12/1986 Raabe et al. ............... 361/647
4,850,014 A *  7/1989 Gillis et al. ............ 379/413.02
(Continued)

*Primary Examiner* — Robert J Hoffberg
*Assistant Examiner* — Michael Matey
(74) *Attorney, Agent, or Firm* — Myers Bigel & Sibley, PA

(57) ABSTRACT

An equipment box assembly includes an open-ended housing and a support plate. The housing has a back wall and opposed sidewalls defining a cavity in the housing. The back wall includes a plurality of mounting features for mounting electronic components to the back wall. The housing is configured to be positioned in an installed position in a mounting surface such that the cavity is recessed in the mounting surface. The support plate includes a plurality of mounting features for mounting electronic components to the support plate. The support plate is releasably mounted in the housing cavity in a first position with the support plate generally parallel to and spaced apart a first distance from the back wall.

15 Claims, 14 Drawing Sheets

(51) Int. Cl.
*H05K 7/14* (2006.01)
*E04F 19/08* (2006.01)

(56) References Cited

U.S. PATENT DOCUMENTS

| | | | |
|---|---|---|---|
| 5,640,295 A * | 6/1997 | Harris et al. | 361/644 |
| 5,721,667 A * | 2/1998 | Rose | 361/627 |
| RE35,929 E * | 10/1998 | Daoud | 379/413.02 |
| 7,075,005 B1 * | 7/2006 | Drane | H02G 3/185 |
| | | | 174/50 |
| 7,109,414 B2 * | 9/2006 | Reynolds | 174/50 |
| 7,589,277 B2 * | 9/2009 | Kessler | H05K 5/0247 |
| | | | 174/480 |
| 7,619,160 B2 * | 11/2009 | Grunwald et al. | 174/50 |
| 7,975,976 B2 | 7/2011 | Wohlford | |
| 8,324,503 B2 | 12/2012 | Pastoriza et al. | |
| 8,365,936 B2 * | 2/2013 | Cox | 220/3.3 |
| 2002/0139555 A1 * | 10/2002 | Dodds et al. | 174/50 |
| 2006/0278422 A1 * | 12/2006 | Drane | 174/66 |
| 2008/0078133 A1 * | 4/2008 | Remmert et al. | 52/281 |
| 2009/0249705 A1 * | 10/2009 | Struthers et al. | 52/27 |
| 2010/0206048 A1 * | 8/2010 | Locke | B66B 11/024 |
| | | | 73/31.03 |
| 2011/0310534 A1 * | 12/2011 | Cosley et al. | 361/632 |
| 2013/0002096 A1 * | 1/2013 | Umeki | H03H 3/04 |
| | | | 310/344 |
| 2013/0321715 A1 * | 12/2013 | Millson et al. | 348/739 |
| 2014/0160717 A1 * | 6/2014 | Malzone et al. | 361/825 |
| 2015/0096239 A1 * | 4/2015 | Frogness | 52/27 |

* cited by examiner

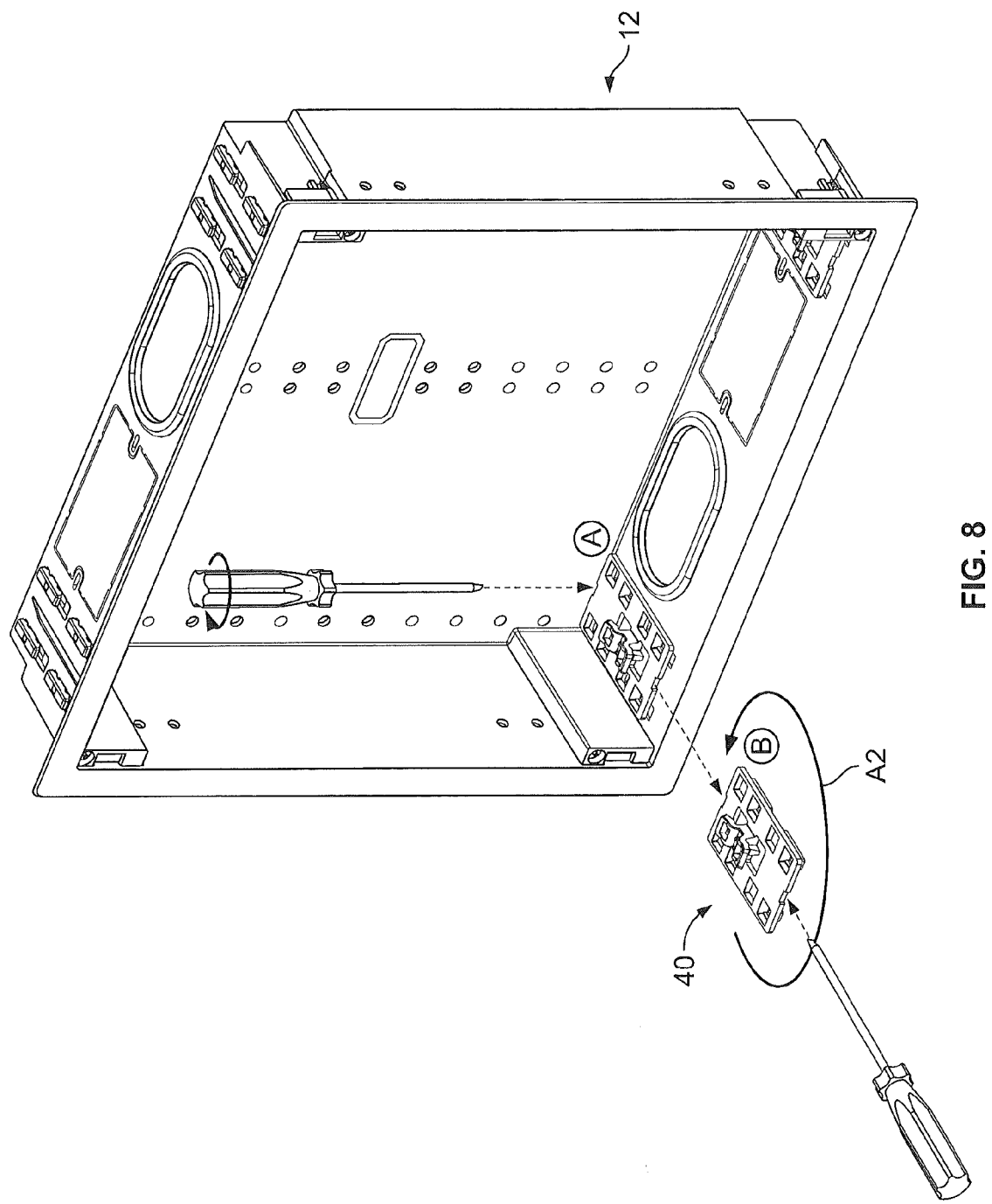

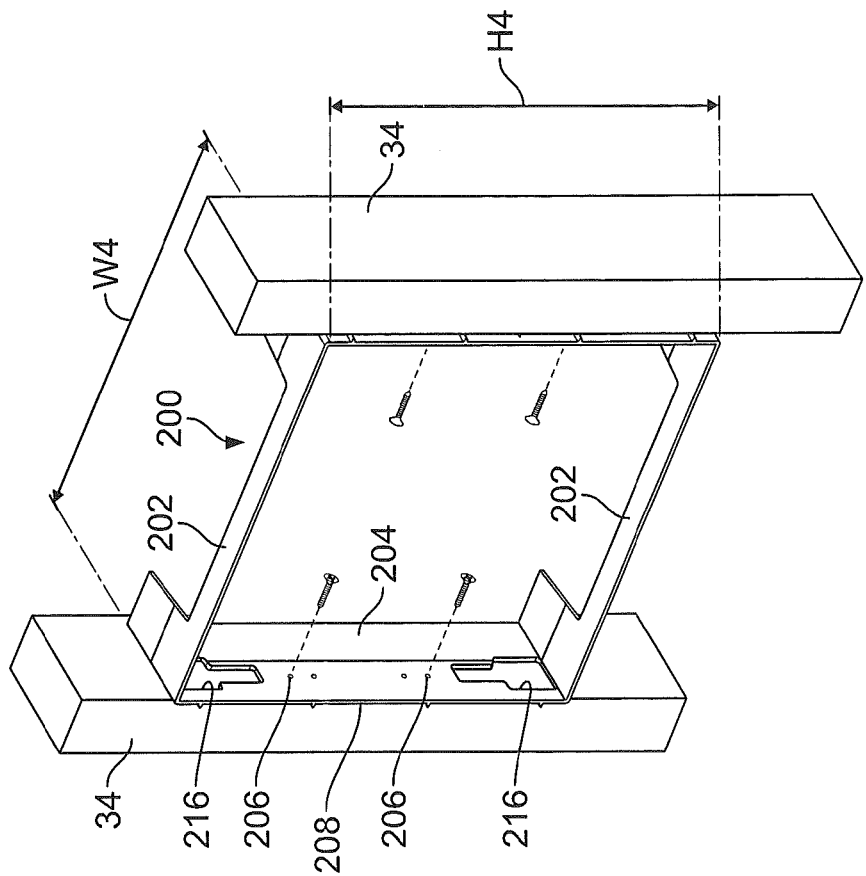
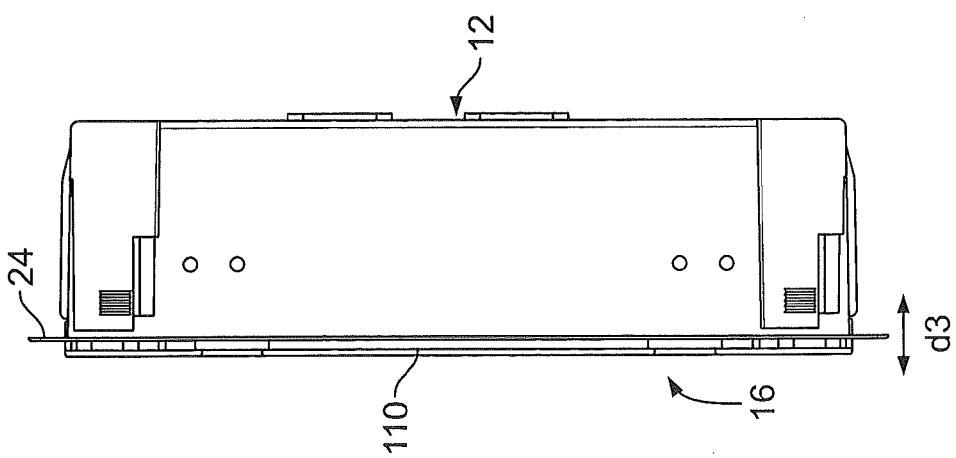

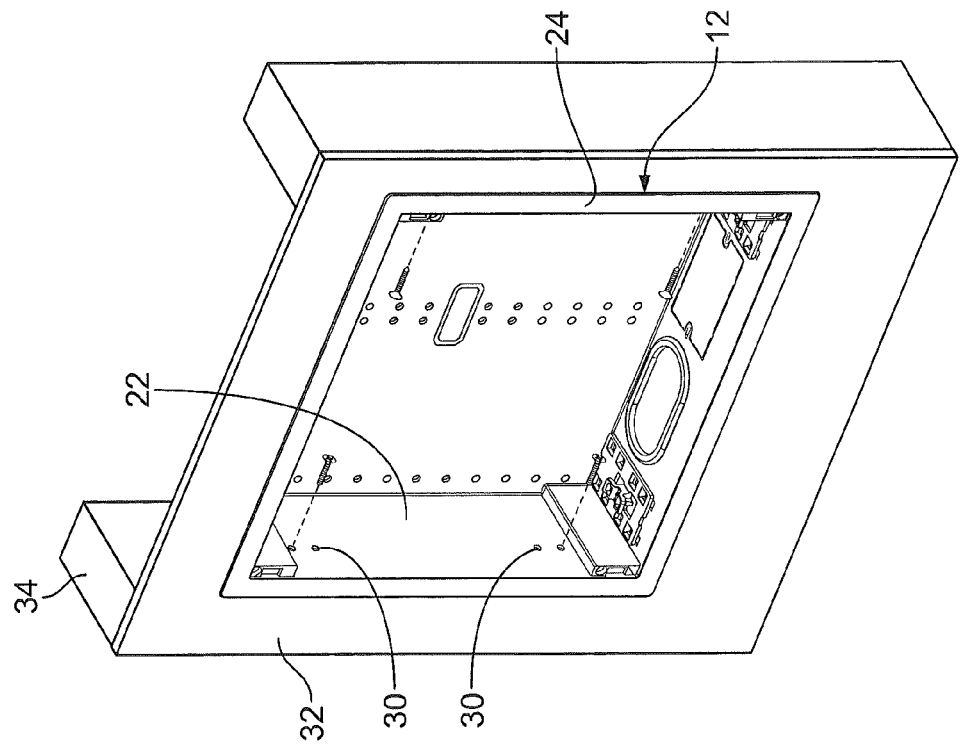
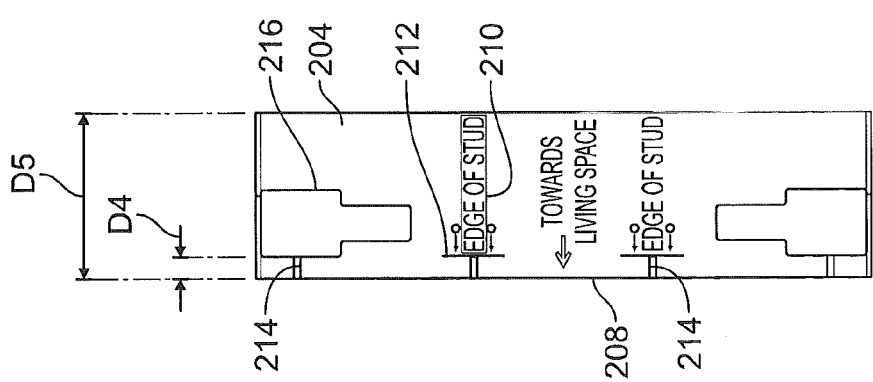
FIG. 18
FIG. 17

RECESSED EQUIPMENT BOXES AND RELATED ASSEMBLIES AND METHODS

BACKGROUND

In-wall recessed boxes have been used with flat panel displays or televisions. The recessed boxes are typically positioned behind the flat panel display and may be used for cable and electrical connection, for example. However, known recessed boxes have limited capability and versatility with regard to mounting electronic components and the like that are used with flat panel displays. In addition, complications can arise when installing recessed boxes, for example in pre-construction installations.

SUMMARY

According to a first aspect, embodiments of the invention are directed to an equipment box assembly. The assembly includes an open-ended housing and a support plate. The housing has a back wall and opposed sidewalls defining a cavity in the housing. The back wall includes a plurality of mounting features for mounting electronic components to the back wall. The housing is configured to be positioned in an installed position in a mounting surface such that the cavity is recessed in the mounting surface. The support plate includes a plurality of mounting features for mounting electronic components to the support plate. The support plate is releasably mounted in the housing cavity in a first position with the support plate generally parallel to and spaced apart a first distance from the back wall.

The assembly may include one or more hinge clips mounted to a first sidewall of the housing, with the support plate pivotably coupled to the housing via the one or more hinge clips at the first sidewall. The support plate may be pivotable between the first position and a rotated position with the support plate partially outside the cavity and generally perpendicular to the back wall of the housing. The assembly may include one or more hinge clips mounted to a second sidewall of the housing that is opposite the first sidewall of the housing, with the support plate pivotably coupled to the housing via the one or more hinge clips at the second sidewall. In some embodiments, the hinge clips are releasably mounted to the first and second sidewalls of the housing. In some embodiments the hinge clips are reversible such that each hinge clip is mountable in a first configuration with the support plate releasably mounted in the first position and in a second configuration with the support plate releasably mounted in the housing cavity in a second position with the support plate generally parallel to and spaced apart from the back wall a second distance from the back wall, with the first distance being greater than the second distance.

The mounting features of the housing back wall may include a plurality of apertures and/or a plurality of knockouts, with each knockout configured to be knocked out to provide an aperture. The mounting features of the support plate may include a plurality of apertures.

In some embodiments, the support plate includes a removable section configured to be selectively removed to accommodate an electronic component mounted to the housing back wall. The support plate may include score lines extending toward adjacent transverse edges of the support plate, with the score lines facilitating removal of the removable section.

The housing may include a peripheral flange extending outwardly away from the sidewalls, with the flange configured to rest against the mounting surface in the installed position. The assembly may include a plurality of extendable doglegs or tabs mounted to the housing (for example, at each of third and fourth opposing sidewalls). In the installed position, each dogleg may be extended away from the housing and the mounting surface may be disposed between the flange and the doglegs. In some embodiments, third and fourth opposing sidewalls of the housing each include one or more apertures configured to receive a fastener to mount the housing to adjacent frame members on which the mounting surface is disposed.

In some embodiments, the assembly includes a cover configured to releasably attach to the housing to at least partially enclose the cavity. The cover may include a plurality of tabs and the housing may include a plurality of slots, with each slot configured to receive a corresponding tab when the cover is attached to the housing. Each slot and/or each corresponding tab may include a height adjustment mechanism for adjusting a distance between the housing back wall and the cover that is attached to the housing. The height adjustment mechanism may include a rack provided on the housing slot and a pair of projections defining a groove on the cover tab, with the projections and/or the groove configured to engage the rack for adjusting the distance between the housing back wall and the cover that is attached to the housing.

One or more of the housing sidewalls may include: a knockout configured to be knocked out to expose an opening in the sidewall for mounting an outlet box or a low voltage ring; and/or a cable entry opening. A flexible grommet may be releasably attached to the cable entry opening.

According to a second aspect, embodiments of the invention are directed to a system for installing an equipment box assembly in a wall. The system includes an installation bracket and an equipment box assembly housing. The installation bracket has opposing top and bottom panels and opposing side panels. Each side panel includes one or more bracket mounting apertures for mounting the side panels to adjacent studs in the wall and one or more housing mounting openings. The equipment box assembly housing has opposing top and bottom panels and opposing side panels. Each side panel includes at least one housing aperture. The housing is sized and configured to be positioned within the installation bracket that has been mounted to the studs in the wall. In position, the housing aperture of each housing side panel is aligned with the housing mounting opening of a respective side panel of the bracket such that the housing can be mounted to the studs in the wall.

In some embodiments, an outer surface of each side panel of the installation bracket includes one or more alignment features for positioning the bracket such that a front of the bracket extends outwardly an extended distance from a front of the studs. The one or more alignment features may include indicia on the side panels to indicate the extended distance and/or spaced-apart raised projections that each extend along the side panel the extended distance from the front of the bracket. The extended distance may be about 0.5 inches.

According to a third aspect, embodiments of the invention are directed to a method for installing an equipment box assembly in a wall. The method includes: installing a pre-construction bracket having opposed side panels between a pair of adjacent studs including fastening each side panel of the bracket to a respective one of the studs; inserting an equipment box housing having opposed side panels in the installed pre-construction bracket such that at least one aperture of each side panel of the housing aligns with at least one opening of a respective side panel of the pre-construction bracket; and fastening the equipment box housing to the studs at the aligned apertures and openings.

In some embodiments, the installing step includes installing the pre-construction bracket such that a front of the bracket extends an extended distance in front of the studs. The method may include applying drywall to the studs after the installing step and before the inserting step, with the drywall having a thickness that is substantially the same as the extended distance.

BRIEF DESCRIPTION OF THE DRAWINGS

FIG. 8 is a perspective view of the housing of FIG. 1 illustrating a hinge clip that may be releasably mounted to the housing in first and second configurations according to some embodiments.

FIG. 15 is a side view of the housing and cover of FIG. 1 illustrating an adjustable connection of the housing and cover according to some embodiments.

FIG. 16 is a perspective view of an installation or pre-construction bracket positioned between wall studs according to some embodiments.

FIG. 17 is a side view of the installation bracket of FIG. 16.

FIG. 18 is a perspective view of the housing of FIG. 1 positioned in the installation bracket of FIG. 16.

Figure 1:
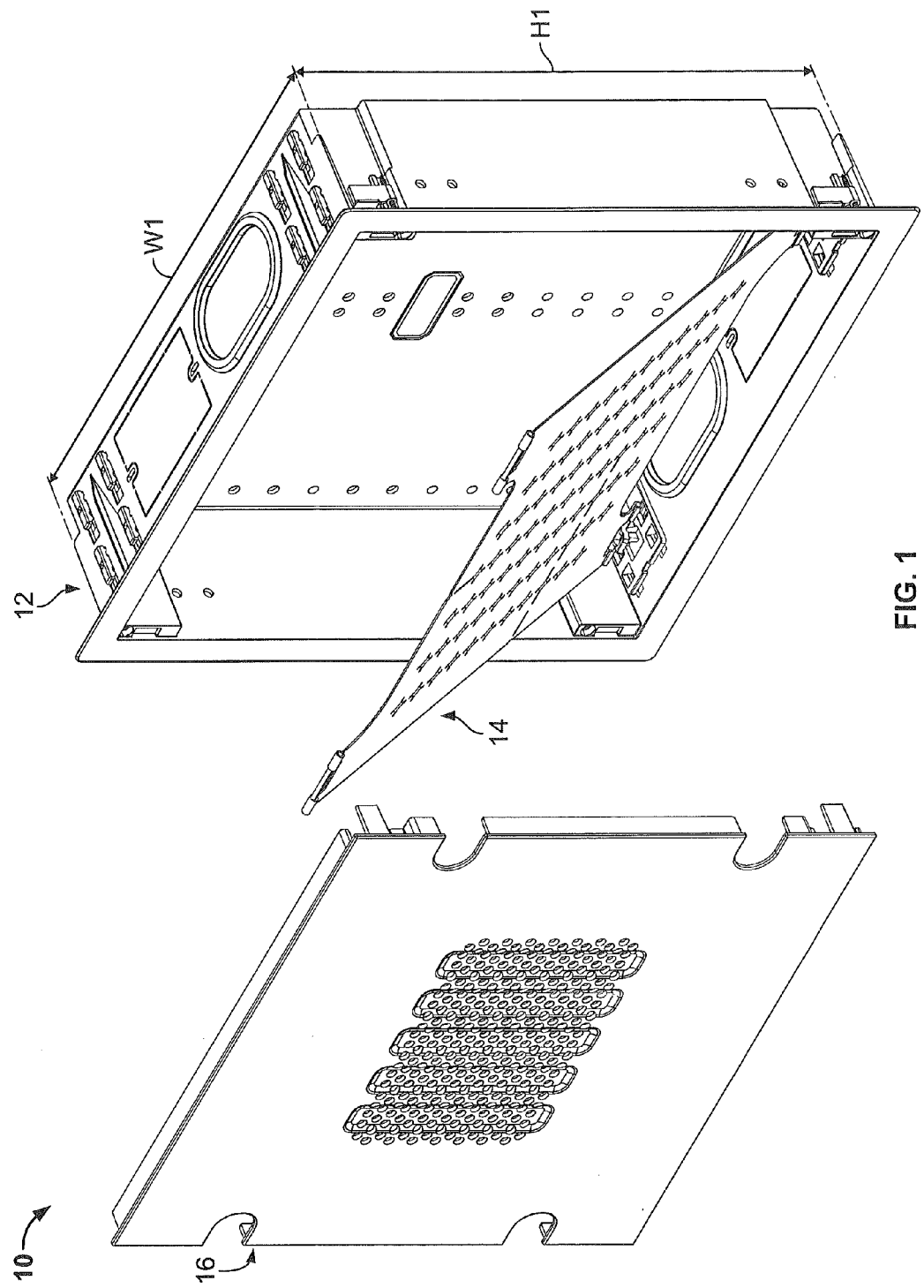
FIG. 1 is a partially exploded perspective view of an equipment box assembly including a housing, a support plate and a cover according to some embodiments.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

Generally speaking, embodiments of the invention are directed to equipment boxes and related assemblies that are configured to be mounted (recessed) in a mounting surface such as a ceiling or a wall. The equipment boxes and related assemblies may be installed in existing ceilings or walls, or may be installed in "new jobs," for example using an optional installation or pre-construction bracket.

An equipment box assembly 10 is shown in FIG. 1. The assembly 10 includes a housing 12, a support plate 14 and a cover 16. The support plate 14 may be releasably and/or pivotably held in the housing 12 and the cover 16 may be positioned (e.g., adjustably positioned) over an opening of the housing 12, as will be described in greater detail below.

Figure 2:
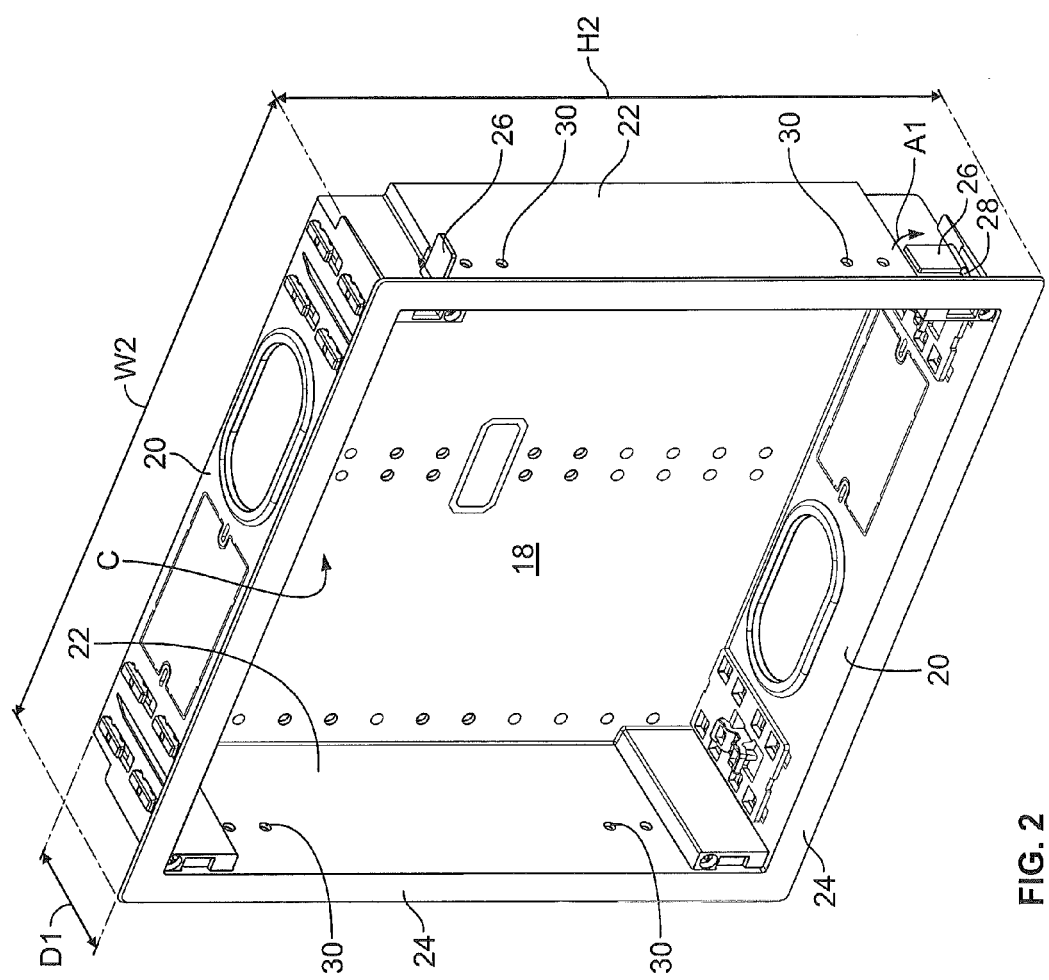
FIG. 2 is a perspective view of the housing of FIG. 1.
Figure 3:
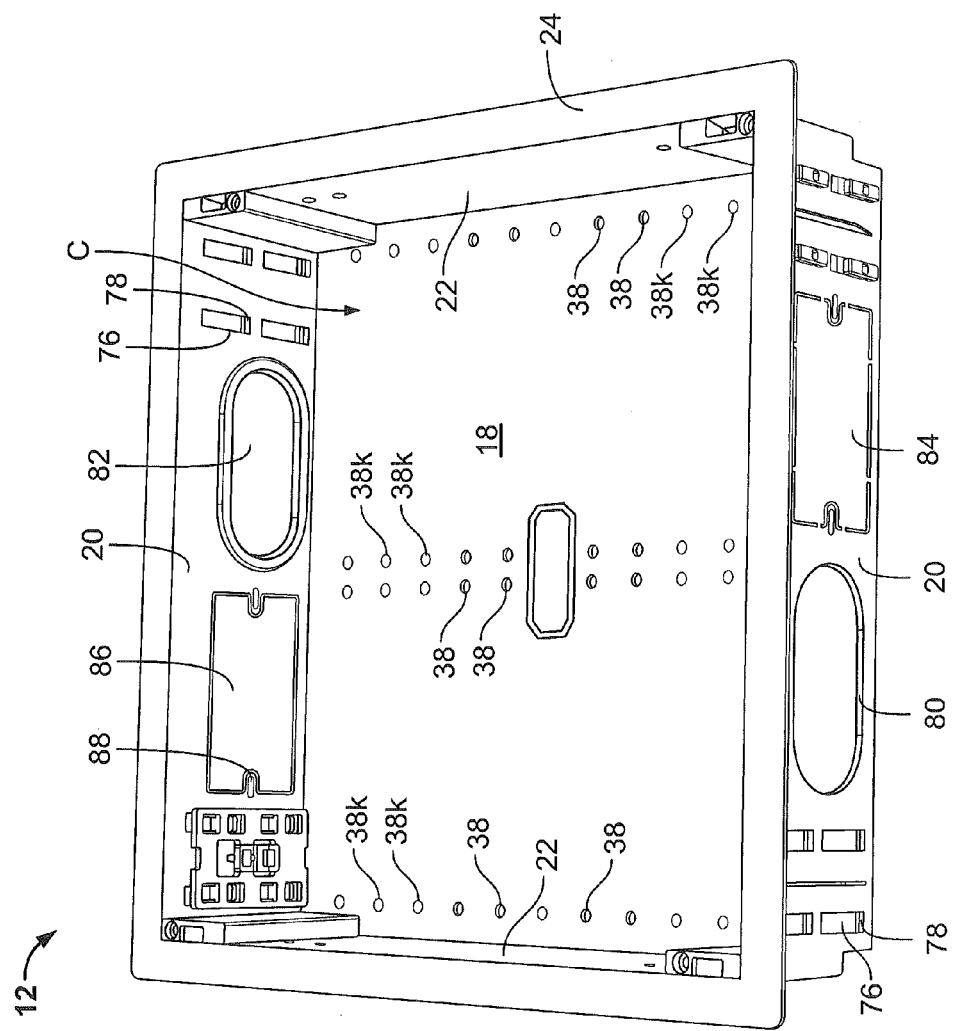
FIG. 3 is a top perspective view of the housing of FIG. 1.

Turning to FIGS. 2 and 3, the housing 12 includes a back panel or wall 18 and a plurality of side panels or sidewalls that extend outwardly or upwardly away from an outer periphery of the back wall 18. The sidewalls include a pair of opposed sidewalls 20 and a pair of opposed sidewalls 22. The back wall 18 and the sidewalls 20, 22 define an open cavity C in the housing 12. As illustrated, the housing 12 takes the form of an open-ended box.

The housing 12 may include a variety of mounting features for mounting or recessing the housing 12 in a mounting surface. As illustrated, a peripheral flange 24 extends outwardly at distal ends of the sidewalls 20, 22. A plurality of doglegs or tabs 26 are coupled to the housing 12 by fasteners 28 (e.g., a screw or other threaded fastener). As indicated by the arrow A1 in FIG. 2, each dogleg 26 is configured to be moved from a retracted position with the dogleg 26 generally parallel to one of the sidewalls 22 to an extended position with the dogleg 26 generally perpendicular to the sidewall 22. Each dogleg 26 may be moved between the retracted and extended positions by manipulating its associated fastener 28. Each dogleg 26 may also be advanced toward the flange 24 and away from the flange 24 by manipulating the fastener 28. Each sidewall 22 also includes a plurality of apertures 30 extending therethrough.

Figure 4:
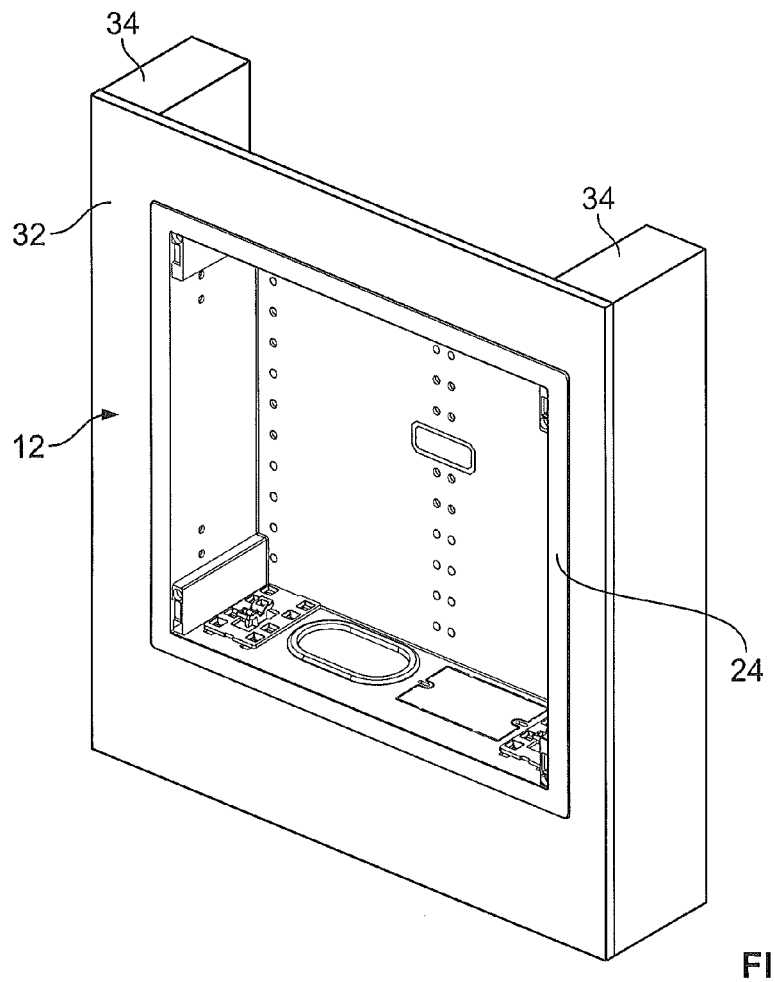
FIG. 4 is a perspective view of the housing of FIG. 1 installed in a mounting surface.
Figure 5:
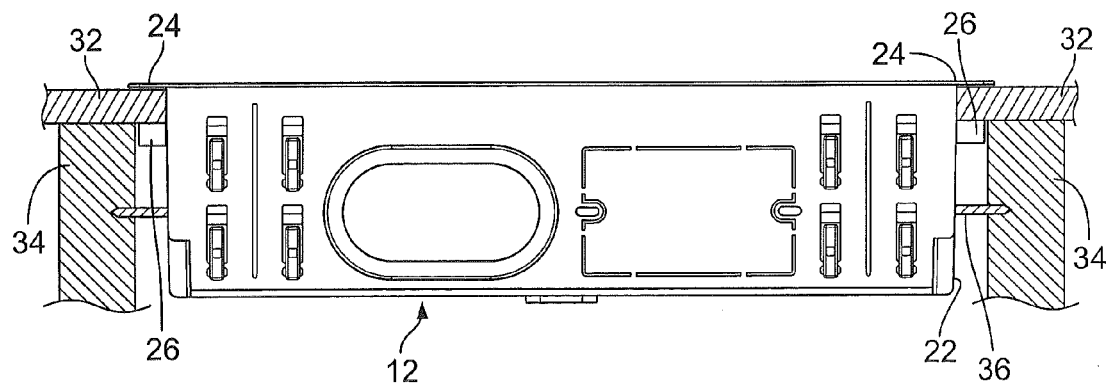
FIG. 5 is an end view of the housing of FIG. 1 installed in a mounting surface.

As illustrated in FIGS. 4 and 5, the housing 12 may be positioned in an installed position against a mounting surface 32, such as a ceiling or a wall. The mounting surface 32 may be drywall, sheetrock, plaster or the like and may be disposed on frame members 34, such as joists or studs. The housing 12 is sized to fit between adjacent frame members 34 with the housing flange 24 flush against the mounting surface 32. For example, the housing 12 may be sized to fit between studs that are 16 inches on center.

The doglegs 26 may be moved to the extended position and advanced toward the flange 24 such that the mounting surface 32 is captured between the flange 24 and the doglegs 26. As shown in FIG. 5, fasteners 36 (e.g., a screw or other threaded fastener) may be received through the apertures 30 in the housing sidewalls 22 (FIG. 2) and advanced into the frame members 34. One or more of the fasteners 36 may be employed if any of the doglegs 26 will not extend due to insufficient clearance between the frame members 34, for example.

Referring again to FIG. 3, a plurality of mounting features may be provided on the back wall 18 of the housing 12 for mounting items such as electronic components to the back wall 18. As illustrated, the mounting features may include apertures 38 formed through the back wall 18. The back wall 18 may also include a plurality of small knockouts 38k that are configured to be knocked out or removed to provide additional apertures as needed. Clips, hooks, hook and loop fasteners, straps and other mounting features known to those of skill in the art may also be employed.

The housing 12 may be formed of any suitable material. In some embodiments, the housing 12 is metal; in other embodiments, the housing is formed of a polymer. In some embodiments, the housing 12 is formed of acrylonitrile butadiene styrene (ABS).

The housing 12 may be generally rectangular or square. Referring to FIG. 1, the housing 12 excluding the flange 24 may have a height H1 of between about 11 and 15 inches, between about 12 and 14 inches, and about 13.25 inches in various embodiments. The housing 12 excluding the flange 24 may have a width W1 of between about 13 and 15 inches, between about 13.5 and 14.5 inches, and about 14 inches in various embodiments. Referring to FIG. 2, the housing 12 including the flange 24 may have a height H2 of between about 12 and 16 inches, between about 13.5 and 15.5 inches, and about 14.5 inches in various embodiments. The housing 12 including the flange 24 may have a width W2 of between about 14 and 16 inches, between about 15 and 16 inches, and about 15.25 inches in various embodiments. In various embodiments, the housing 12 may have a depth D1 of between about 2 and 6 inches, between about 3 and 5 inches, and about 3.8 inches.

Figure 6:
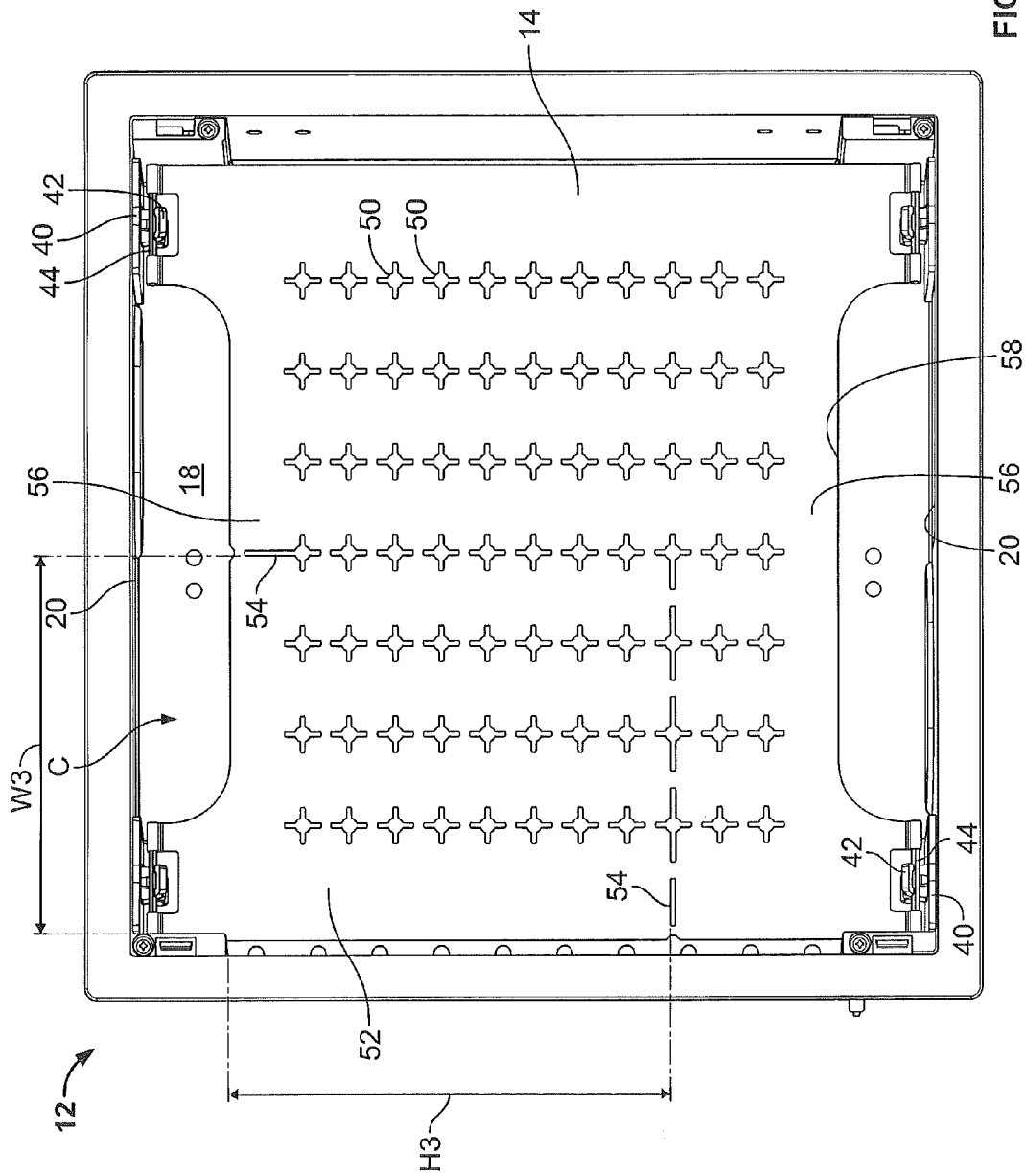
FIG. 6 is a front view of the housing and support plate of FIG. 1.

Turning now to FIG. 6, the support plate 14 is shown releasably mounted in the cavity C of the housing 12. As illustrated, two hinge brackets or hinge clips 40 are attached to each sidewall 20 in a spaced-apart relationship. Each hinge bracket 40 includes a clip member 42 that is configured to receive and releasably hold a pivot bar 44 of the support plate 14. The hinge brackets 40 are configured to hold the support plate 14 spaced apart from the back wall 18 of the housing 12 with the support plate 14 generally parallel to the back wall 18. The support plate 14 allows for two layers of components or equipment to be mounted in the housing 12, as will be discussed in more detail below.

The support plate 14 includes a plurality of apertures or perforations 50 extending therethrough. The apertures 50 are for mounting items such as electronic equipment and/or for cable or wire management. In some embodiments, and as illustrated, the apertures 50 may include a center opening and a plurality of elongated slots extending away from the center opening. Clips, hooks, hook and loop fasteners, straps and other mounting features known to those of skill in the art may also be employed in addition to or instead of the apertures 50.

The support plate 14 may include a removable section 52. Score lines 54 extend to or near adjacent transverse edges of the support plate 14 to facilitate removal of the removable section 52. The removable section 52 may be removed using a tool (e.g., tin snips) and/or by bending (e.g., fatiguing) the support plate 14 at the score lines 54. Removal of the removable section 52 may be desirable when a relatively large (deep) electronic component is mounted to the back wall 18 of the housing 12.

The support plate 14 is sized and shaped to fit within a major portion of the housing cavity C. The removable section 52 may have a height H3 of about 7 inches and a width W3 of about 6.5 inches. The removable section 52 may be sized differently, and additional portions of the support plate 14 may be selectively removed as needed, for example using tin snips.

Opposing edge portions 56 of the support plate 14 include recesses or valleys 58 that extend inwardly toward the center of the support plate 14. The recesses 58 may facilitate cable management. The recesses 58 may also allow a user to grip the support plate to insert, remove and/or pivot the support plate 14 with respect to the hinge clips 40.

The support plate 24 may be formed of any suitable material. In some embodiments, the support plate 24 is metal; in other embodiments, the support plate is formed of a polymer. In some embodiments, the support plate 24 comprises aluminum or steel.

Figure 7:
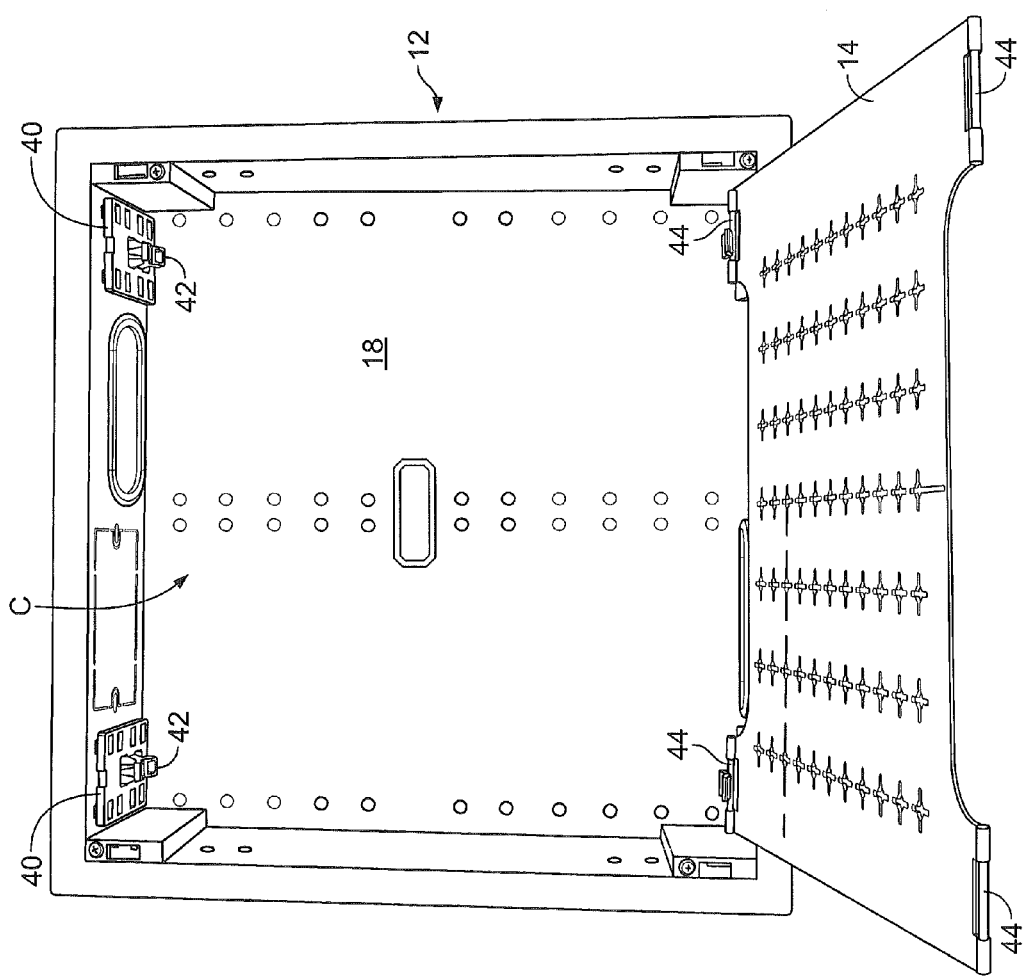
FIG. 7 is a front view of the housing and support plate of FIG. 6 with the support plate in a pivoted position.

As shown in FIG. 7, the support plate 14 may be pivotably coupled to the hinge clips 40 such that the support plate 14 may be disengaged from one pair of the hinge clips 40 and pivoted at the other pair of the hinge clips 40. Specifically, each of a pair of support plate pivot bars 44 may be disengaged with its associated hinge clip member 42 and the support plate may be pivoted about an axis defined by the other pair of the support plate pivot bars 44. In some embodiments, the support plate 14 is pivotable between a first position with the support plate 14 in the cavity C and generally parallel to and spaced apart from the housing back wall 18 (e.g., FIG. 6) and a second position with the support plate 14 partially outside the cavity C and generally perpendicular to the housing back wall 18 (e.g., FIG. 7). It will be appreciated that the support plate 14 may be pivoted in an opposite direction to that shown in FIG. 7; that is, the support plate 14 may be pivotably held by the other pair of hinge clips 40 and pivoted about an axis defined by the other pair of support plate pivot bars 44.

Figure 10B:
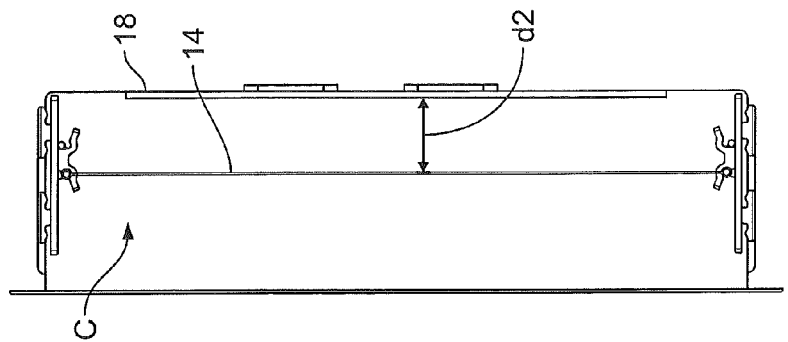
FIGS. 10A and 10B are side views of the housing and the support plate of FIG. 1, with the support plate mounted in first and second positions corresponding to the first and second configurations of the hinge clip of FIG. 8.
Figure 10A:
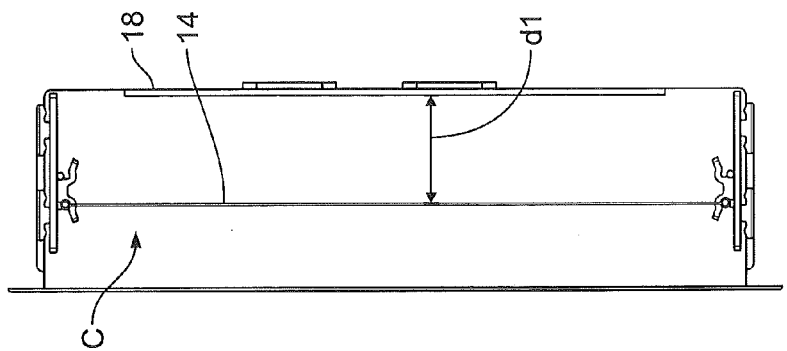
Figure 9:
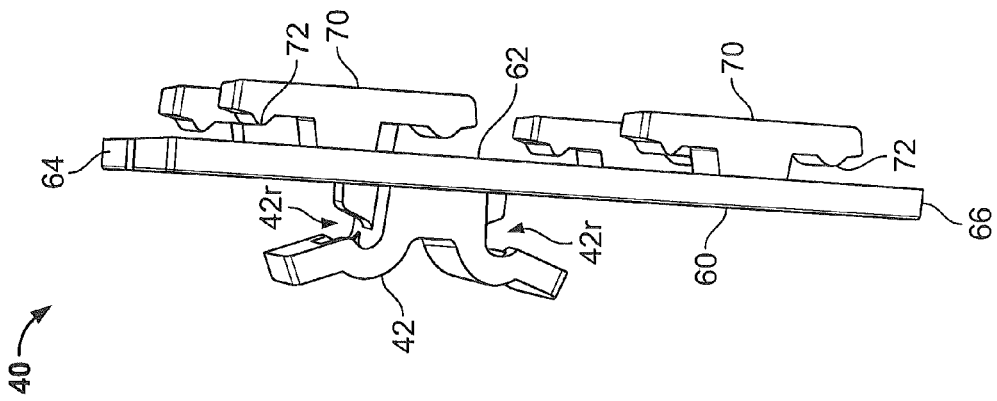
FIG. 9 is a side view of the hinge clip of FIG. 8.

Turning to FIGS. 8-10, each hinge clip 40 may be reversible for additional installation options. Each hinge clip 40 may be releasably mounted to the housing 12 in a first configuration A shown in FIG. 8, removed from the housing 12, rotated 180 degrees as shown by the arrow A2 to a second configuration B, and reinserted or releasably mounted to the housing 12 in the second configuration B. With the hinge clips 40 in the first configuration, the support plate 14 may be held in a first position in the housing cavity C with the support plate 14 generally parallel to and spaced apart a first distance d1 from the housing back wall 18 (FIG. 10A). With the hinge clips 40 in the second configuration, the support plate 14 may be held in a second position in the housing cavity C with the support plate 14 generally parallel to and spaced apart a second distance d2 from the housing back wall 18 (FIG. 10B). As illustrated, the first distance d1 is greater than the second distance d2. In some embodiments, the first distance d1 is about 2 inches and the second distance d2 is about 1.4 inches.

One of the hinge clips 40 is shown in greater detail in FIG. 9. The hinge clip 40 includes opposing faces 60, 62 and opposite ends 64, 66. The clip member 42 is provided on the face 60 and includes a pair of receiving pockets or portions 42r, with one of the receiving pockets 42r configured to receive one of the support plate pivot bars 44 when the hinge clip 40 is in the first configuration, and with the other one of the receiving pockets 42r configured to receive the pivot bar 44 when the hinge clip 40 is in the second configuration. The clip member 42 is positioned closer to the end 64 than the end 66 such that the support plate 14 will be spaced apart a different distance from the housing back wall 18 when the hinge clips 40 are in the different configurations (e.g., the distances d1 and d2 shown in FIGS. 10A and 10B).

A plurality of tabs 70 are provided on the opposite face 62 of the hinge clip 40. As illustrated, each tab 70 includes a pair of projections 72. Referring back to FIG. 3, the housing may include a plurality of elongated slots 76 and adjacent apertures or openings 78. The hinge clip 40 may be releasably (and reversibly) mounted to the housing such that each tab 70 is received in one of the slots 76 and one of the projections 72 is received in an adjacent opening 78.

Still referring to FIG. 3, the housing 12 may include one or more cable entry ports 80. As illustrated, each sidewall 20 includes a cable entry port 80. A grommet 82 may be provided at each cable entry port 80. The grommet 82 may be removably attached to the cable entry port 80. The grommet 82 may be formed of a flexible, resilient material that allows the grommet 80 to be cut, pierced, slit and the like.

The housing 12 may also include one or more large knockouts 84. As illustrated, each sidewall 20 includes a knockout 84. The knockouts 84 are configured to be knocked out or removed to expose an opening 86 for installing components such as a low voltage ring or an outlet box. Screw tabs 88 may be provided; the screw tabs 88 may be retained if a low voltage ring is being mounted or may be removed to install an outlet box.

As noted above, the provision of the support plate 14 allows for two layers of components to be mounted in the housing 12. It will be appreciated that the support plate effectively provides two relatively large mounting surfaces for mounting components within the housing and/or for enhanced cable management. It will also be appreciated that the pivotable support plate 14 allows for access of components mounted on the "rear layer" or the back wall 18 of the housing 12.

The removable section 52 of the support plate 14 and/or the reversible hinge clips 40 provide further installation flexibility. As noted above, the removable section 52 may be removed to accommodate larger (e.g., deeper) components such as a network music player. Further, the hinge clips 40 may be reversed to provide different layer depths for additional flexibility. For example, the support plate 14 may be held in the second position shown in FIG. 10B to allow for larger components to be mounted to the "front layer" or on the support plate 14 (e.g., to make such components more accessible and/or for improved ventilation).

Figure 11:
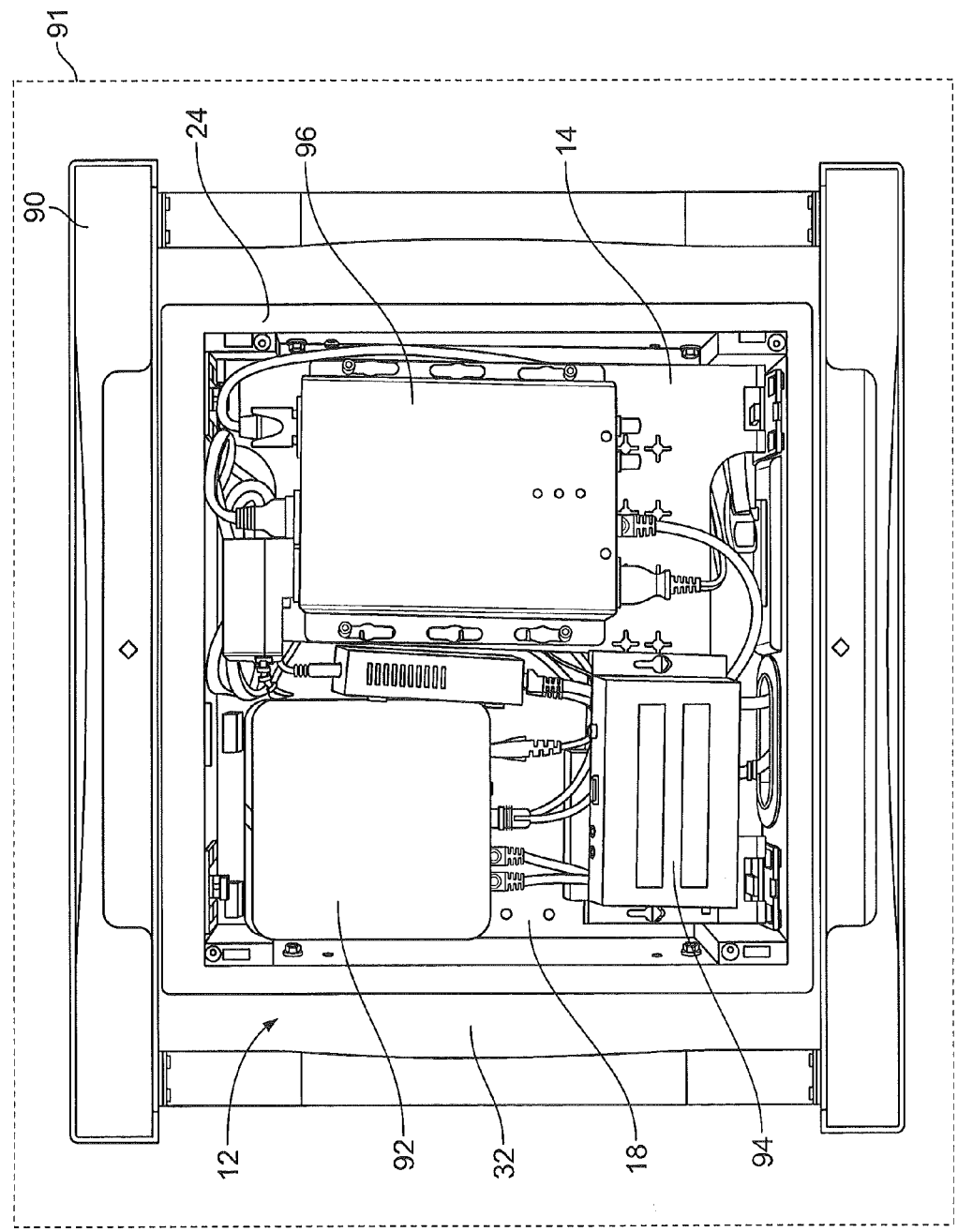
FIG. 11 is a front view of the housing and support plate of FIG. 1, with the housing mounted in a mounting surface and electronic components mounted to the housing and the support plate.
Figure 12:
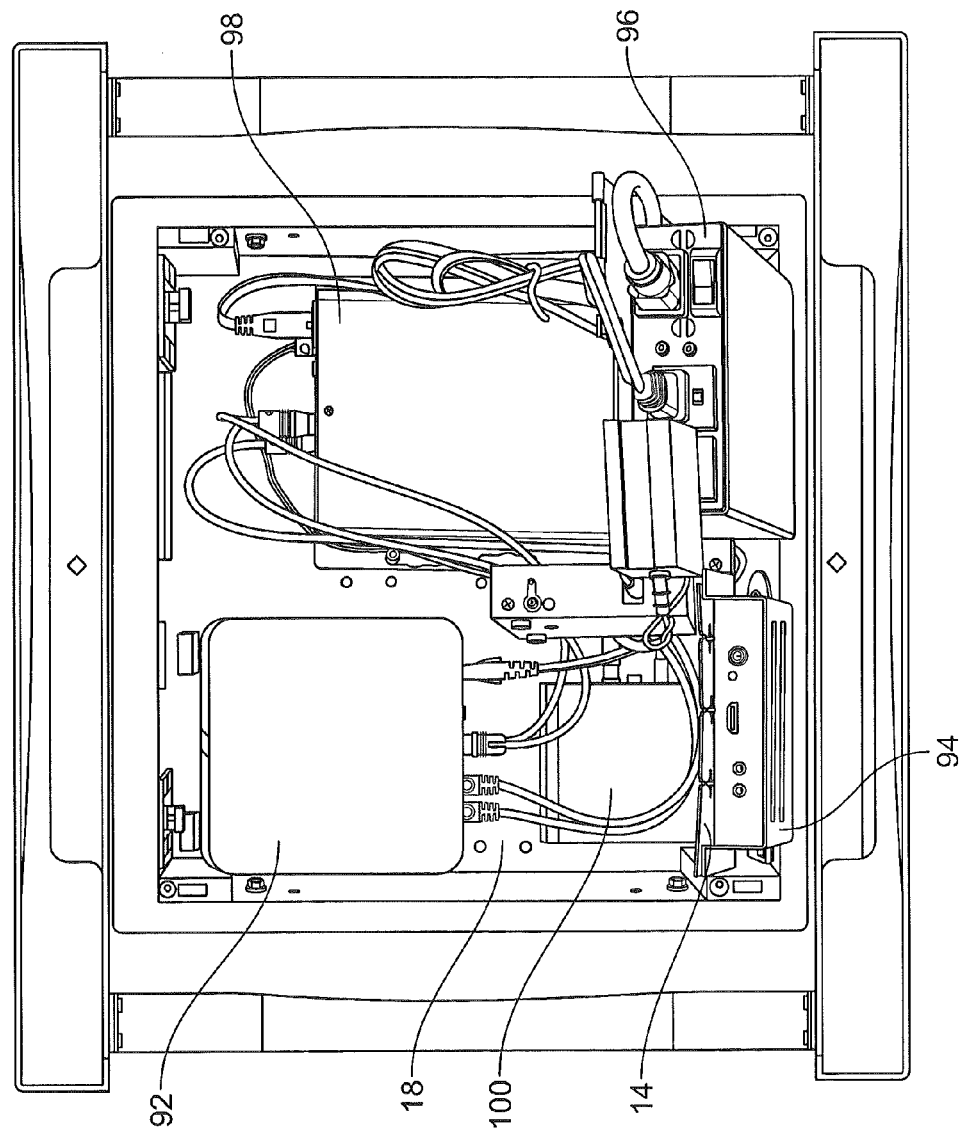
FIG. 12 is a front view of the housing and support plate of FIG. 11, with the support plate in a pivoted position and illustrating additional electronic components mounted to a back wall of the housing.

Some of these desirable characteristics are exemplified in FIGS. 11 and 12. The housing 12 is shown recessed in the mounting surface 32 with the housing flange 24 flush against the mounting surface 32. A portion of a flat panel display mount 90 is shown mounted to the mounting surface 32 and surrounding the housing 12. The display mount 90 may be used for mounting a flat panel display 91 in front of the housing 12 and associated components (e.g., the support plate 14, the components mounted to the housing 12 and the support plate 14 and/or the cover 16 which is not shown in FIGS. 11 and 12). The flat panel display can obscure these components and the recessed nature of the housing 12 allows for low profile mounting of the flat panel display.

As shown in FIG. 11, the removable section of the support plate 14 has been removed to accommodate a relatively large component 92 such as a network music player that is mounted to the back wall 18 of the housing 12. Additional components are shown mounted to the support plate 14, including an audio/video extender receiver 94 and a power conditioner 96.

In FIG. 12, the support plate 14 has been pivoted downwardly, thereby exposing additional components mounted to the housing back wall 18 (i.e., the second layer of components). As illustrated, these components include an amplifier 98 and a wireless subwoofer transmitter 100. Pivoting the support plate 14 allows access to these components, as well as additional access to the components 92, 94, 96 and any associated cables, wires, switches, etc.

A wide variety of components and equipment may be installed or mounted to the support plate 14 and/or the housing back wall 18. These include audio components such as amplifiers, wireless speaker transmitters and distributed audio components (Sonos, etc.) as well as video components such as distributed video components (HDMI extenders, etc.), cable boxes (e.g., DirecTV client box) and Smart TV boxes (Apple TV, Roku, etc.). Power products such as outlets, surge protectors and power conditioners and network components such as wireless access points, switches and routers may also be installed. Other equipment that may be installed includes control systems or processors (e.g., Pro Control), surveillance components (e.g., analog to digital converters) and cable management equipment.

Figure 13:
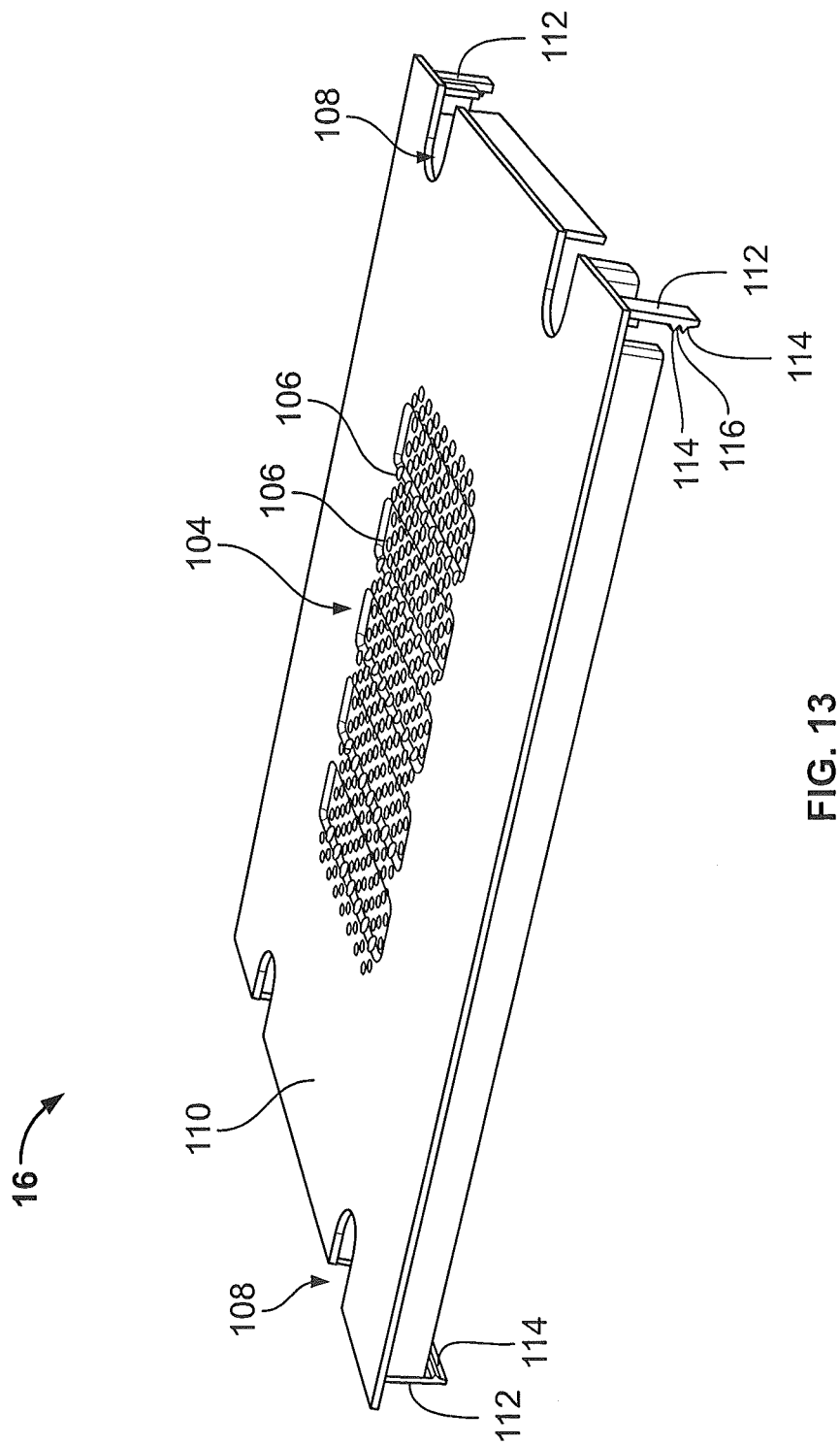
FIG. 13 is a top perspective view of the cover of FIG. 1 according to some embodiments.

The cover 16 is illustrated in FIG. 13. The cover 16 is configured to releasably attach or mount to the housing 12 to thereby enclose the components held in the housing 12 and/or provide a pleasing final appearance (which may be particularly desirable when the housing 12 and cover 16 are not obscured by an object such as a flat panel display, for example in ceiling installations). The housing 16 includes a vent 104 which, as illustrated, may include a plurality of spaced-apart apertures 106. A plurality of recesses 108 are provided to accommodate a user's fingers for attaching and removing the cover 16.

In some embodiments, the housing 12 and/or the cover 16 includes a height adjustment mechanism such that the cover 16 can be attached or mounted to the housing 12 in a variety of positions. Specifically, the height adjustment mechanism may allow the cover 16 to be mounted such that a front surface 110 of the cover 16 is generally flush with the flange 24 of the housing 12 or to be mounted at one or more positions with the front surface 110 positioned forwardly of the flange 24.

Figure 14:
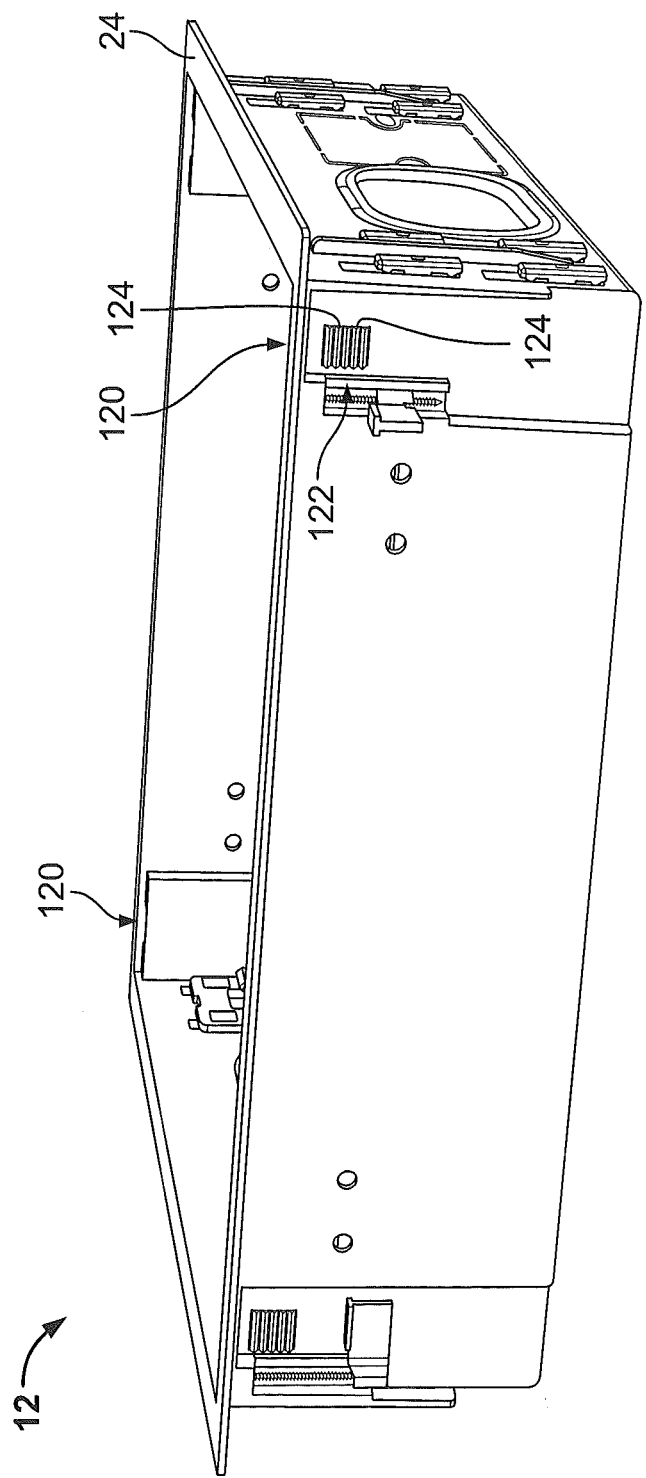
FIG. 14 is a side perspective view of the housing of FIG. 1 according to some embodiments.

As illustrated in FIGS. 13 and 14, the cover 16 includes a plurality of tabs 112 and the housing 12 includes a plurality of slots 120, with each slot 120 configured to receive a corresponding tab 112 when the cover 16 is attached to the housing 12. An inner surface of each tab 112 includes a pair of projections 114 defining a groove 116 therebetween. Each slot 120 includes a rack 122 including a plurality of projections 124 (with grooves formed between adjacent projections). The projections 114 and/or the groove 116 of each tab 112 is configured to engage the rack 122 of a corresponding slot 120 when the cover 16 is adjustably attached to the housing 12.

Therefore, as shown in FIG. 15, the cover 16 can be mounted to the housing 12 in a variety of positions (indicated by the arrow d3). Such a configuration may be useful if the position and/or size of electronic equipment in the housing 12 prevents the cover from closing completely (e.g., with the cover front surface 110 flush with the housing flange 14). The height adjustment mechanism allows the cover to still be attached and left partially extended (e.g., with the cover front surface 110 positioned forwardly of the housing flange 24).

The cover 16 may be formed of any suitable material. In some embodiments, the cover 16 is metal; in other embodiments, the cover is formed of a polymer. In some embodiments, the cover 16 is formed of acrylonitrile butadiene styrene (ABS).

An installation or pre-construction bracket or ring 200 is shown in FIGS. 16-18. The bracket 200 may be used to prepare a location for the housing 12 in "new work" applications before drywall is hung on the studs. The bracket 200 includes opposed top and bottom panels 202 and opposed side panels 204. The bracket 200 is sized and configured to fit between adjacent studs 34. The bracket 200 may have a height H4 of between about 12 and 16 inches, between about 13 and 14 inches, and about 13.8 inches in various embodiments. The bracket 200 may have a width W4 of between about 13.5 and 15.5 inches, between about 14 and 15 inches, and about 14.4 inches in various embodiments. In various embodiments, the bracket 200 may have a depth D5 of between about 3 and 5 inches, between about 3 and 4 inches, and about 3.75 inches.

The bracket 200 may be formed of any suitable material. In some embodiments, the bracket 200 is metal; in other embodiments, the cover is formed of a polymer. In some embodiments, the bracket 200 is formed of acrylonitrile butadiene styrene (ABS).

Each side panel 204 of the bracket 200 includes one or more bracket mounting apertures 206. The bracket mounting apertures 206 are configured to receive fasteners therethrough to mount the bracket 200 to the studs 34. It is contemplated that the bracket 200 may be coupled to the studs 34 in different ways; for example, the bracket 200 may be sized to be push fit between the studs 34 and/or be adhered to the studs 34.

As shown in FIG. 17, each side panel 204 of the bracket 200 includes one or more alignment features for positioning the bracket 200 such that a front 208 of the bracket 200 extends forwardly an extended distance D4 in front of the studs 34. The extended distance D4 accounts for the thickness of the drywall which is later applied to the studs 34. In some embodiments, the extended distance D4 is about 0.5 inches.

The alignment feature(s) may include indicia 210, 212 on an outer surface of the bracket side panels 204. The indicia 210 may include written indicia such as "Edge of Stud." The indicia 212 may include a guide line that is spaced apart the extended distance D4 from the front 208 of the bracket 200.

The alignment feature(s) may include a plurality of raised projections 214 on the outer surface of the bracket side panels 204. The raised projections 214 extend along the side panel 204 from the bracket front 208 to a depth corresponding to the extended distance D4.

Drywall 32 may be applied after the bracket 200 is positioned and mounted to the studs 34 as described above. The equipment box housing 12 is then positioned within the bracket 200 with the housing flange 24 flush against the drywall 32. Each bracket side panel 204 includes one or more openings 216. With the housing 12 in position, the aperture(s) 30 in the housing sidewalls 22 align with the bracket openings 216. The housing 12 is then secured to the studs 34 using fasteners that extend through the apertures 30 and the openings 216.

The housing 12 may be prepared (e.g., by opening various knockouts) prior to placing the housing 12 in position. The support plate 14 and the cover 16 may then be installed as described above. Embodiments of the invention include kits including any combination of the housing 12, the support plate 14, the cover 16 and the bracket 200.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the teachings and advantages of this invention. Accordingly, all such modifications are intended to be included within the scope of this invention as defined in the claims. The invention is defined by the following claims, with equivalents of the claims to be included therein.

That which is claimed is:

1. An equipment box assembly, comprising:
an open-ended housing having a back wall and opposed sidewalls defining a cavity in the housing, the housing comprising a peripheral flange extending outwardly away from a front of the sidewalls, wherein the flange is generally parallel to and spaced apart from the back wall, and wherein the housing is configured to be positioned in an installed position in a mounting surface such that the cavity is recessed in the mounting surface;
a support plate comprising a plurality of mounting features for mounting electronic components to the support plate, the support plate releasably mounted in the housing cavity in a first position with the support plate generally parallel to and spaced apart a first distance from the back wall;

one or more hinge clips mounted to a first sidewall of the housing, wherein the support plate is pivotably coupled to the housing via the one or more hinge clips at the first sidewall; and one or more hinge clips mounted to a second sidewall of the housing that is opposite the first sidewall of the housing, wherein the support plate is pivotably coupled to the housing via the one or more hinge clips at the second sidewall;

wherein the support plate in the first position is closer to the back wall than to the flange;

wherein:
the hinge clips are releasably mounted to the first and second sidewalls of the housing;
the hinge clips are reversible such that each hinge clip is mountable in a first configuration with the support plate releasably mounted in the first position and in a second configuration with the support plate releasably mounted in the housing cavity in a second position with the support plate generally parallel to and spaced apart from the back wall a second distance from the back wall, wherein the first distance is less than the second distance.

2. The assembly of claim 1, wherein the support plate is pivotable between the first position and a rotated position with the support plate partially outside the cavity and generally perpendicular to the back wall of the housing.

3. The assembly of claim 1, wherein the housing back wall includes a plurality of mounting features for mounting electronic components to the back wall, the plurality of mounting features including at least one of the following:
a plurality of apertures; and
a plurality of knockouts, each knockout configured to be knocked out to provide an aperture.

4. The assembly of claim 1, wherein the mounting features of the support plate comprise a plurality of apertures.

5. The assembly of claim 1, wherein the support plate includes a removable section configured to be selectively removed to accommodate an electronic component mounted to the housing back wall.

6. The assembly of claim 5, wherein the support plate includes score lines extending toward adjacent transverse edges of the support plate, the score lines facilitating removal of the removable section.

7. The assembly of claim 1, wherein the flange is configured to rest against the mounting surface in the installed position.

8. The assembly of claim 7, further comprising a plurality of extendable doglegs mounted to the housing, wherein, in the installed position, each dogleg is extended away from the housing and the mounting surface is disposed between the flange and the doglegs.

9. The assembly of claim 1, wherein third and fourth opposing sidewalls of the housing each include one or more apertures configured to receive a fastener to mount the housing to adjacent frame members on which the mounting surface is disposed.

10. The assembly of claim 1, further comprising a cover configured to releasably attach to the housing to at least partially enclose the cavity.

11. The assembly of claim 10, wherein the cover includes a plurality of tabs and the housing includes a plurality of slots, each slot configured to receive a corresponding tab when the cover is attached to the housing.

12. The assembly of claim 1, wherein one or more of the sidewalls includes at least one of the following:
a knockout configured to be knocked out to expose an opening in the sidewall for mounting an outlet box or a low voltage ring; and
a cable entry opening.

13. The assembly of claim 1 in combination with one or more audio/video components mounted to the support plate.

14. An equipment box assembly, comprising:
an open-ended housing having a back wall and opposed sidewalls defining a cavity in the housing, the housing comprising a peripheral flange extending outwardly away from a front of the sidewalls, wherein the flange is generally parallel to and spaced apart from the back wall, and wherein the housing is configured to be positioned in an installed position in a mounting surface such that the cavity is recessed in the mounting surface;
a support plate comprising a plurality of mounting features for mounting electronic components to the support plate, the support plate releasably mounted in the housing cavity in a first position with the support plate generally parallel to and spaced apart a first distance from the back wall; and
a cover configured to releasably attach to the housing to at least partially enclose the cavity;
wherein the support plate in the first position is closer to the back wall than to the flange;
wherein the cover includes a plurality of tabs and the housing includes a plurality of slots, each slot configured to receive a corresponding tab when the cover is attached to the housing;
wherein each slot and/or each corresponding tab includes a height adjustment mechanism for adjusting a distance between the housing back wall and the cover that is attached to the housing.

15. The assembly of claim 14, wherein the height adjustment mechanism includes a rack provided on the housing slot and a pair of projections defining a groove on the cover tab, the projections and/or the groove configured to engage the rack for adjusting the distance between the housing back wall and the cover that is attached to the housing.

* * * * *